US012668128B2

(12) United States Patent  
Conigliaro et al.

(10) Patent No.: US 12,668,128 B2  
(45) Date of Patent: Jun. 30, 2026

(54) ROAD VEHICLE PROVIDED WITH A DASHBOARD WITH A CENTRAL INFORMATION DISPLAY SCREEN LOCATED BETWEEN THE DRIVER AND PASSENGER AND WITH A SUPPORTING PLATE LOCATED BEHIND THE STEERING WHEEL THAT SUPPORTS HUMAN-VEHICLE INTERFACE CONTROLS AND AN INFORMATION DISPLAY SCREEN

(71) Applicant: FERRARI S.P.A., Modena (IT)

(72) Inventors: Vito Conigliaro, Modena (IT); Thierry Annequin-Digond, Modena (IT); Thomas Granjard, Modena (IT)

(73) Assignee: FERRARI S.P.A., Modena (IT)

( * ) Notice: Subject to any disclaimer, the term of this patent is extended or adjusted under 35 U.S.C. 154(b) by 0 days.

(21) Appl. No.: 18/987,341

(22) Filed: Dec. 19, 2024

(65) Prior Publication Data

US 2025/0206139 A1      Jun. 26, 2025

(30) Foreign Application Priority Data

Dec. 20, 2023      (IT) ........................ 102023000027414

(51) Int. Cl.  
    *B60K 35/53*         (2024.01)  
    *B60K 35/22*         (2024.01)  
           (Continued)

(52) U.S. Cl.  
    CPC .............. *B60K 35/53* (2024.01); *B60K 35/22* (2024.01); *B60K 35/60* (2024.01); *H05K 5/0226* (2013.01); *B62D 1/18* (2013.01)

(58) Field of Classification Search  
    CPC ........ B60K 35/60; B60K 35/22; B60K 35/53; H05K 5/0226; B62D 1/18  
    See application file for complete search history.

(56) References Cited

U.S. PATENT DOCUMENTS

2005/0200112 A1*  9/2005  Berg ...................... B60K 35/50  
                        280/775  
2020/0114763 A1*  4/2020  Eom ...................... G06F 1/1652  
            (Continued)

FOREIGN PATENT DOCUMENTS

DE      102015226586 A1    6/2017  
DE      102018101538 A1    7/2019  
            (Continued)

OTHER PUBLICATIONS

Espace translation of DE-102021113720-A1 (Year: 2021).*

(Continued)

*Primary Examiner* — Vivek D Koppikar  
*Assistant Examiner* — Scott Lawrence Strickler  
(74) *Attorney, Agent, or Firm* — Leason Ellis LLP

(57) ABSTRACT

Road vehicle having a longitudinal direction parallel to the direction of travel and a transverse direction perpendicular to the longitudinal direction; the road vehicle comprises a steering wheel inside the passenger compartment on the driver's side; a dashboard and a steering column on one side connected to the steering wheel and on the opposite side connected to the dashboard; wherein the dashboard comprises:

a supporting plate behind the steering wheel that supports human-vehicle interface controls and a first information display screen;  
    a central information display screen along the transverse direction at the side of the supporting plate toward the passenger;  
    wherein the plate and the central screen are integrated with each other in a single structure.

13 Claims, 7 Drawing Sheets

(51) Int. Cl.
  B60K 35/60 (2024.01)
  H05K 5/02 (2006.01)
  *B62D 1/18* (2006.01)

(56) References Cited

U.S. PATENT DOCUMENTS

| | | | |
|---|---|---|---|
| 2021/0291660 A1* | 9/2021 | Szczerba | B60K 35/22 |
| 2022/0198967 A1* | 6/2022 | Kim | G09F 9/301 |
| 2023/0209752 A1* | 6/2023 | Yun | G06F 1/1652 |
| | | | 361/807 |

FOREIGN PATENT DOCUMENTS

| | | | | |
|---|---|---|---|---|
| DE | 102020101145 A1 * | 7/2021 | | B60K 35/53 |
| DE | 102021113720 A1 * | 12/2022 | | B60K 35/223 |
| DE | 102008058285 B4 | 5/2023 | | |

OTHER PUBLICATIONS

Espace translation of DE-102020101145-A1 (Year: 2020).*
Italian International Search Report and Written Opinion in IT Application No. 202300027414 mailed Jul. 17, 2024, an English translation attached herewith. (6 pages).

* cited by examiner

*Fig.7*
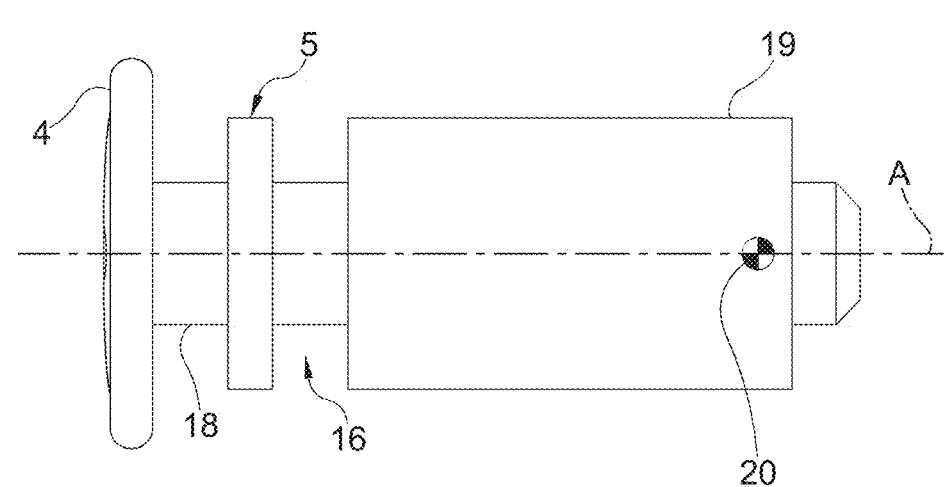
*Fig.8*
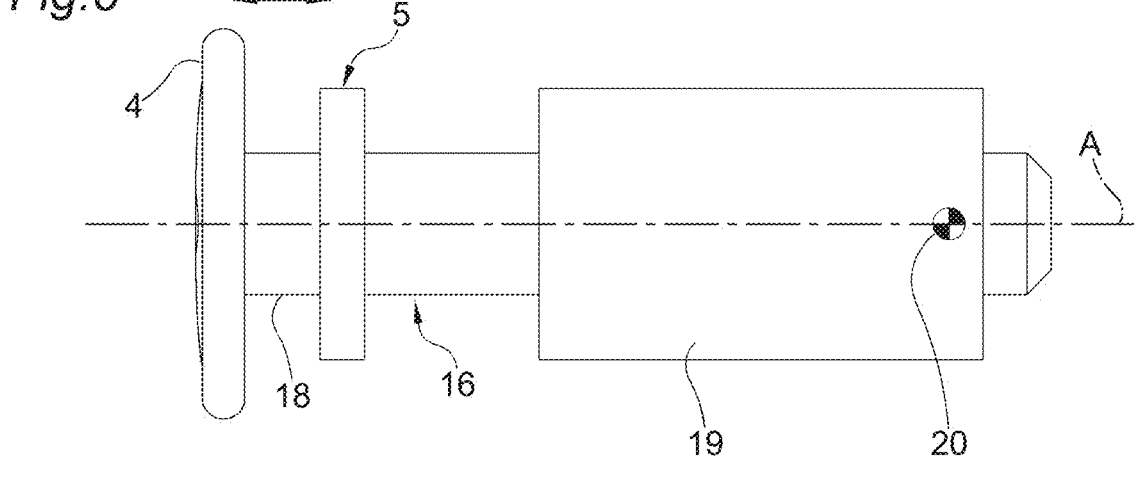
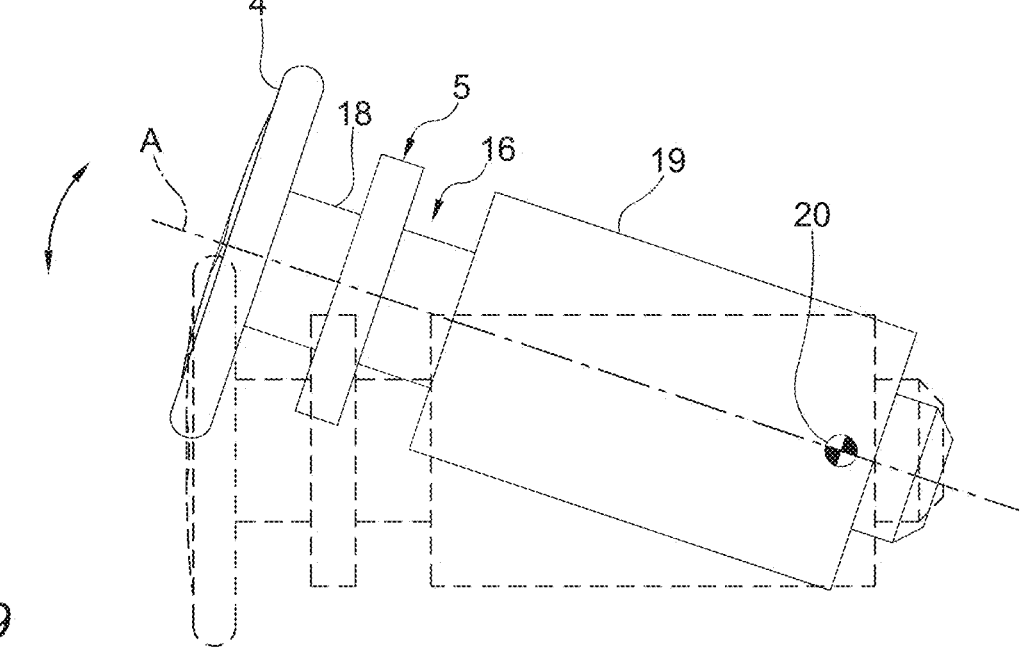
*Fig.9*

ROAD VEHICLE PROVIDED WITH A DASHBOARD WITH A CENTRAL INFORMATION DISPLAY SCREEN LOCATED BETWEEN THE DRIVER AND PASSENGER AND WITH A SUPPORTING PLATE LOCATED BEHIND THE STEERING WHEEL THAT SUPPORTS HUMAN-VEHICLE INTERFACE CONTROLS AND AN INFORMATION DISPLAY SCREEN

CROSS-REFERENCE TO RELATED APPLICATIONS

This patent application claims priority from Italian patent application no. 102023000027414 filed on Dec. 20, 2023, the entire disclosure of which is incorporated herein by reference.

TECHNICAL FIELD

The present invention relates to a road vehicle provided with a passenger compartment with a dashboard equipped with a supporting plate behind the steering wheel, which supports human-vehicle interface controls and a first information display screen, and with a central information display screen arranged between the driver and passenger. In such background, the present invention will deal with the problem of how to optimize the cooperation between the aforementioned plate located behind the steering wheel and the driver.

PRIOR ART

Generally, road vehicles are provided with a plurality of display devices arranged at the dash panel of the road vehicle.

Historically, a road vehicle comprises at least one driver-facing display device such as, for example, the screens or the indicators arranged on the portion of the dashboard interposed between the steering wheel and the dashboard. Such display device housed behind the steering wheel is supported by a plate that houses an information display screen and that can also support, in a known manner, the instrument panel. Usually, most of such plates located behind the steering wheel are integrated in the dash panel, i.e. are integral with the dash panel.

In recent years, inside the passenger compartment it is known to also provide for other screens that complete the information display for the driver and also for the possible passenger. In general, the arrangement of a central screen (between the driver and passenger) of increasingly lager dimensions is becoming increasingly popular, especially in fully electrically-driven cars; however, in most cases, such central screens protrude in an overbearing and unaesthetic manner from the dash panel to which they are connected, nullifying part of the work that interior designers do to define the shapes and curves of the dash panel. Furthermore, a very large central screen is appreciated during quiet driving on public roads (namely subjected to compliance with the highway code) since it allows viewing various pieces of information both useful for indicating the road ahead (namely provided by the navigation system), and relative to the music entertainment system and to the air conditioning system. However, a very large central screen is not much appreciated during performance driving on track, during which the driver's attention must be completely devoted to driving, and neither a navigation system nor a music entertainment system is certainly used.

The simplest solution to this problem might seem to be at first to turn off at least a part of the central screen during performance driving on track; however, this solution is generally not much appreciated by the users of the road vehicle because it gives the impression that the central screen is malfunctioning or is not correctly set up.

In alternative, in order to resolve this problem, it has been proposed to mount on the dash panel a rotatable supporting body which has a larger face on which a larger screen is mounted and a smaller face on which a smaller screen is mounted; by rotating the supporting body it is possible to alternatively show the driver the larger screen (when the driver selects quiet driving on public roads) or the smaller screen (when the driver selects performance driving on track). However, this solution is definitely expensive and complex to manufacture and especially requires a considerable increase in weight and size. In general, therefore, to date there is no valid solution as to how to allow the central screen to assume different configurations in the passenger compartment both in terms of dimensions of the screen and in terms of its orientation in space for making it more reachable and visible for the driver.

Furthermore, especially in the case of sports vehicles where usually the seats are not adjustable for moving closer to or moving away from the control plate, in order to reach the human-vehicle interface controls the driver must sometimes stretch making uncomfortable movements that negatively affect the control of the vehicle.

DESCRIPTION OF THE INVENTION

The object of the present invention is to provide a road vehicle, provided with a control and supporting plate, with a first screen located behind the steering wheel and with a central information display screen, wherein the accessibility to the plate (in terms of better contact comfort for the driver) is improved and the collaboration between plate and central screen is improved for resolving the drawbacks of the prior art mentioned in the foregoing.

According to the present invention, a road vehicle according to claim 1 is provided, provided with a dashboard with a supporting plate, wherein such supporting plate is located behind the steering wheel and supports human-vehicle interface controls and a first information display screen, and with a central information display screen. The main aspect of the invention lies in the fact that the plate and the central screen are integrated in a single structure and, in particular, that the central screen is capable of assuming different configurations with respect to the plate. Furthermore, according to the invention, the entire integrated plate (with the human-vehicle interface controls and the first screen) and central screen structure can be movable with respect to the dashboard, for example it can be integrally constrained to the movable steering column with respect to the dashboard.

According to the present invention, the instrument panel is not integrated in the innovative single plate and central screen structure with variable attitude which supports the human-vehicle interface ("HMI") controls and the display screens.

In addition to the advantage linked to the fact that the integrated plate and central screen structure of the present invention can assume different positions and configurations with respect to the dashboard, as it will be evident in an example also thanks to the fact of being made integral with the adjustable steering column, there is also the advantage related to the better identification of the HMI controls (being "grouped" in a single area which is precisely the innovative control plate) with consequent reduction in distraction when driving. The dependent claims describe preferred embodiments of the present invention forming integral part of the present description.

BRIEF DESCRIPTION OF THE DRAWINGS

The present invention will now be described with reference to the accompanying drawings, which illustrate a non-limiting example embodiment thereof, wherein:

FIGS. 6-9 show an example of the present invention wherein the entire structure integrated with the plate and central screen is integral with the steering column of the steering wheel for integrally following the movements thereof with respect to the fixed dashboard.

PREFERRED EMBODIMENTS OF THE INVENTION

Figure 1:
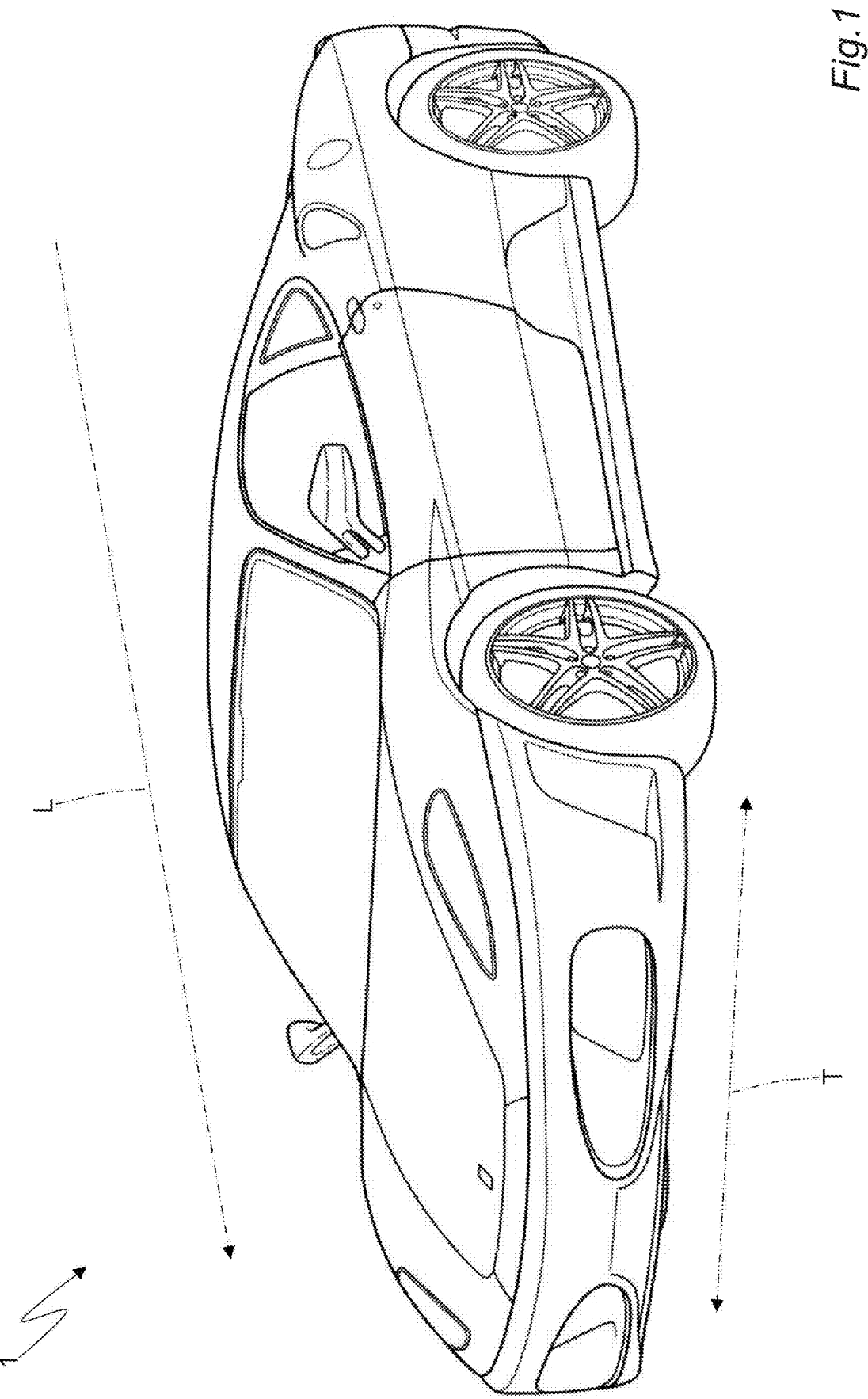
FIG. 1 is a perspective view of a road vehicle manufactured in accordance with the present invention.

In FIG. 1, reference numeral 1 indicates, as a whole, a road vehicle (in particular a car) provided with a passenger compartment 2 in which a dashboard 3 (illustrated in FIGS. 2, 7 and 10) is inserted. In the road vehicle 1 a longitudinal direction L is identified parallel to the (forward or backward) direction of travel and a transverse direction T is identified which is perpendicular to the direction of travel and thus to the longitudinal direction L; namely, the longitudinal direction L extends from the rear to the front of the road vehicle 1, whereas the longitudinal direction T extends from side to side of the road vehicle 1.

Figure 2:
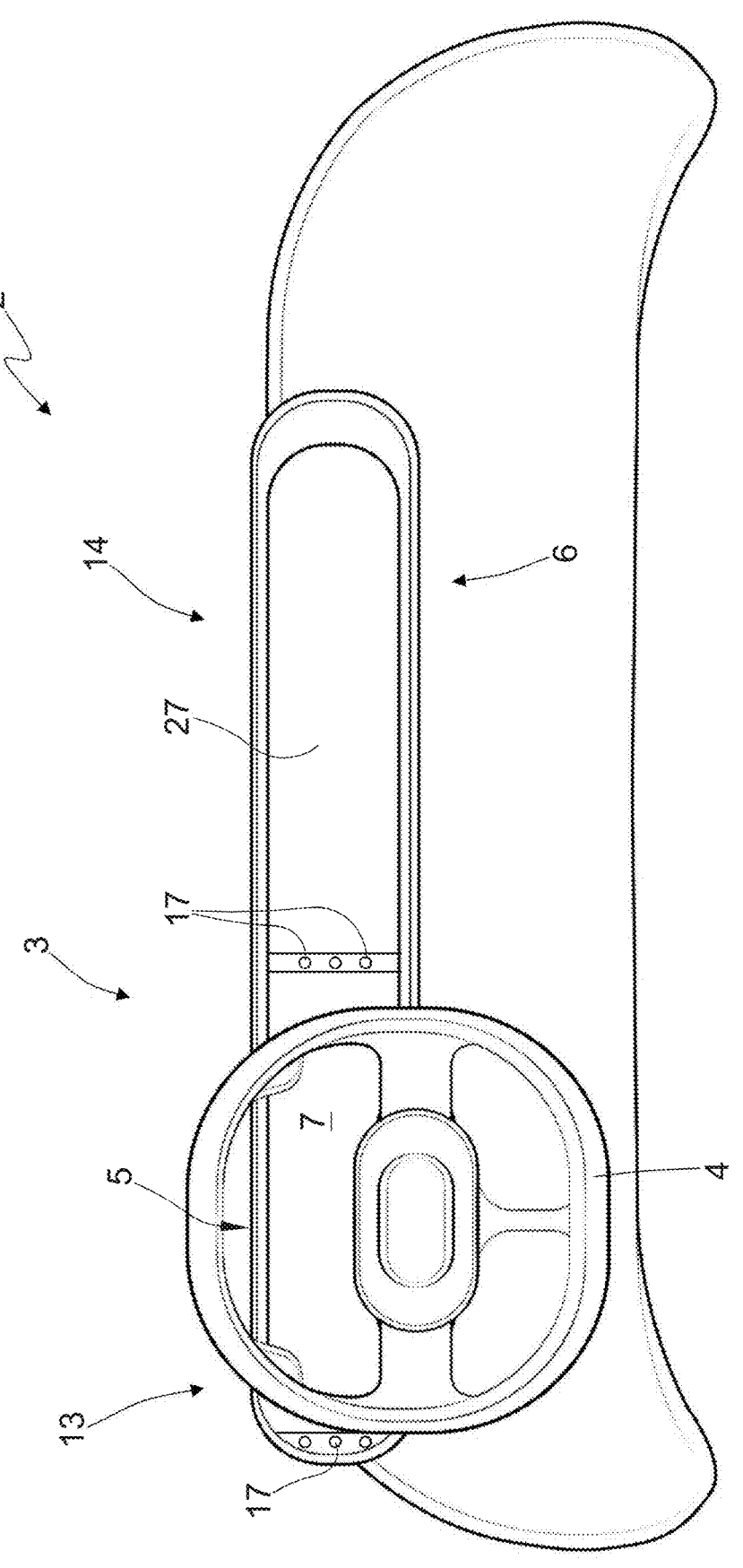
FIG. 2 is a front view, with parts removed for clarity, of part of a dashboard of the road vehicle of FIG. 1 according to the present invention in which an integrated structure is present comprising a plate located behind the steering wheel, supporting human-vehicle interface controls and an information display screen, and a central information display screen.

As is visible in FIG. 2, the dashboard 3 comprises a portion located in front of the driver behind a steering wheel 4. In particular, the dashboard 3 houses in part the steering column, namely the rod element with an end in the passenger compartment on which the steering wheel 4 is mounted. According to the present invention, the dashboard 3 is an element to be considered fixed, whereas the steering wheel 4 can also be of movable type, i.e. is adjustable, with respect to the dashboard 3. Such variable or adjustable attitude of the steering wheel 4 with respect to the dashboard 3 is known per se. In particular, the steering wheel 4 can translate along the axis A of the steering column 16, for moving closer to or moving away from the dashboard 3 and/or can rotate around an axis parallel to the transverse direction T at a rotation point inside the dashboard 3 (inner end) for tilting the steering wheel 4. The dashboard 3 substantially comprises behind the steering wheel 4 a plate 5, which in this example has a substantially parallelepiped shape along the main direction T which supports the human-vehicle interface controls 17 and a display device 6 with an information display screen 7. For the purposes of the present invention, the plate 5 can be of any type and also the controls 17, their positioning and the nature and characteristics of the screen are not limiting aspects. In FIG. 2, reference numeral 27 identifies a central information display screen 27. The term "central" refers to the fact that the screen 27 is along the direction T at the side of the plate 5 toward the passenger. According to the present invention, and as is schematically shown in FIG. 2, the central screen 27 is laterally coupled to the edge of the plate 5 toward the passenger's side and together they make an integrated structure thus equipped with the controls 17, the first screen 7 located behind the steering wheel and the central screen 27.

Figure 3:
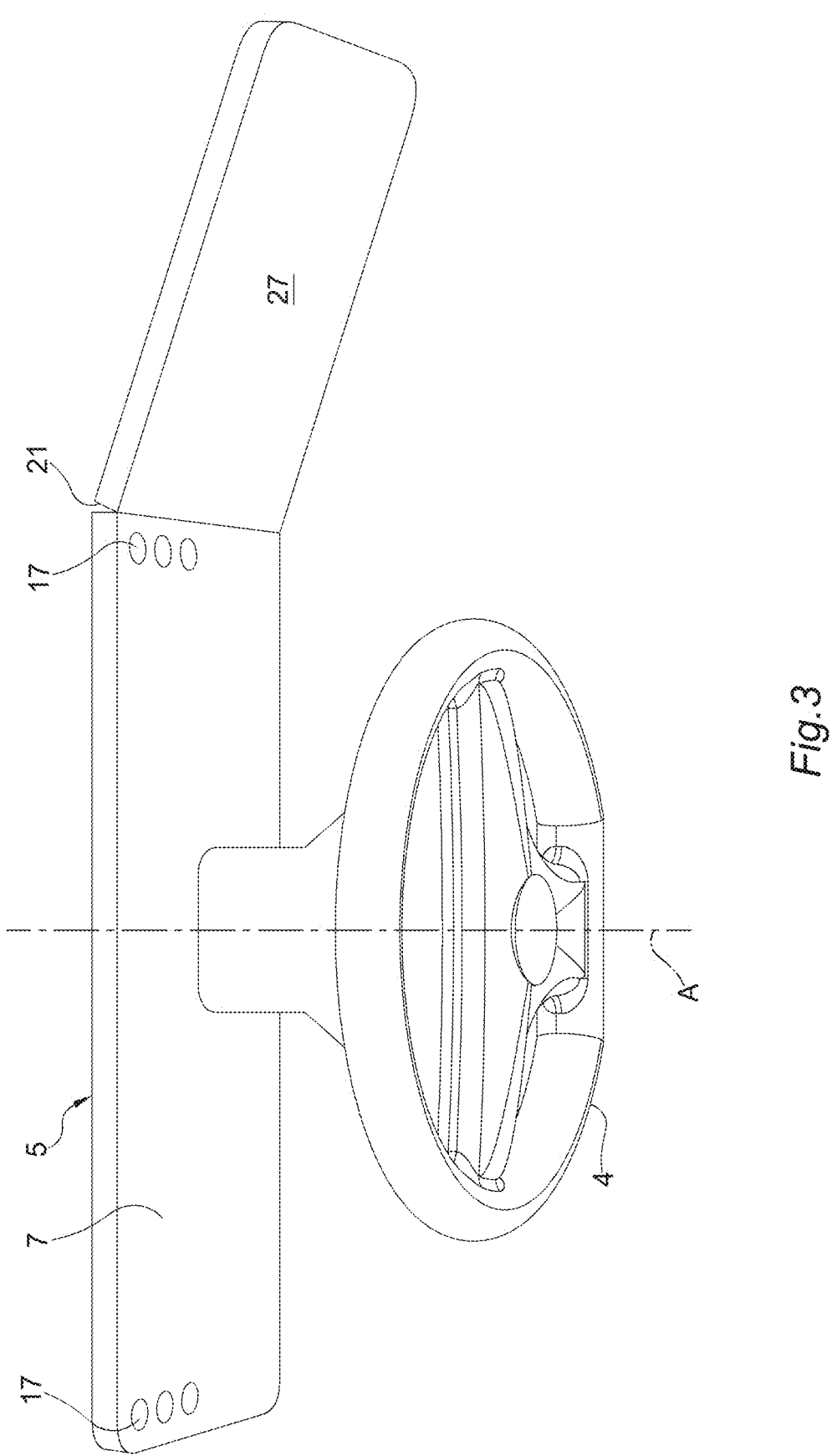
FIGS. 3-5 show different embodiments wherein the central screen can assume different conformations with respect to the supporting plate.

In addition to the fact that the central screen 27 is integrated with the plate 5 for making the aforementioned single structure, according to the present invention the central screen 27 can assume different conformations with respect to the supporting plate 5. In particular, according to the example of FIG. 3, the central screen 27 is constrained to the side edge of the plate 5 by means of a substantially vertical hinge 21 so that it can assume angles variable between 180° and less than 180° with respect to the plate 5. With such movement, the central screen 27 can thus be more oriented toward the driver. In this example, the central screen 27 substantially has the same shape of the plate 5, thereby in a non-angled position it makes a continuous surface without interruptions with the same support 5 and the structure integrating the plate 5 and screen 27 is in actual fact a continuous single body.

Figure 4:
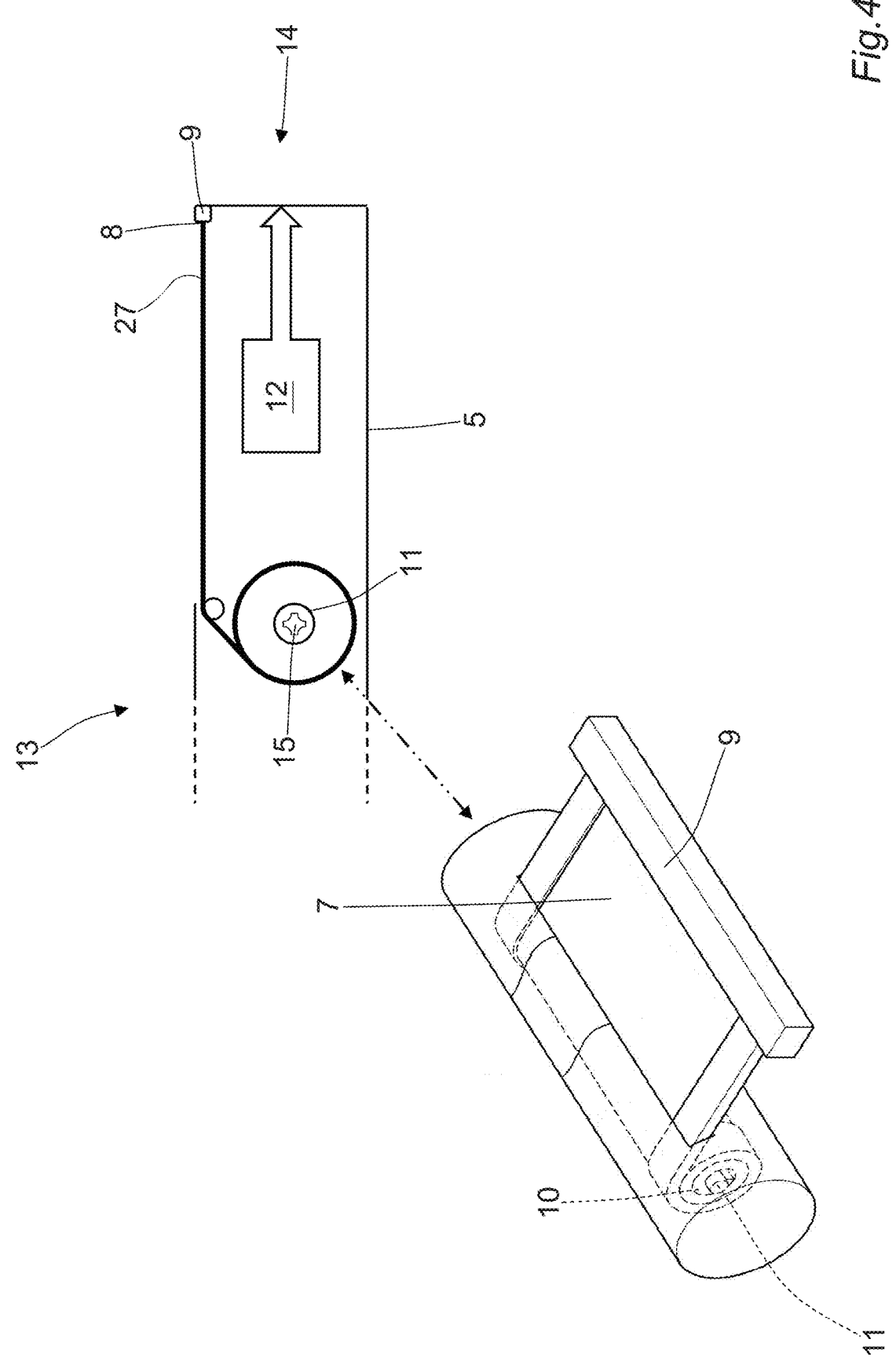
Figure 5:
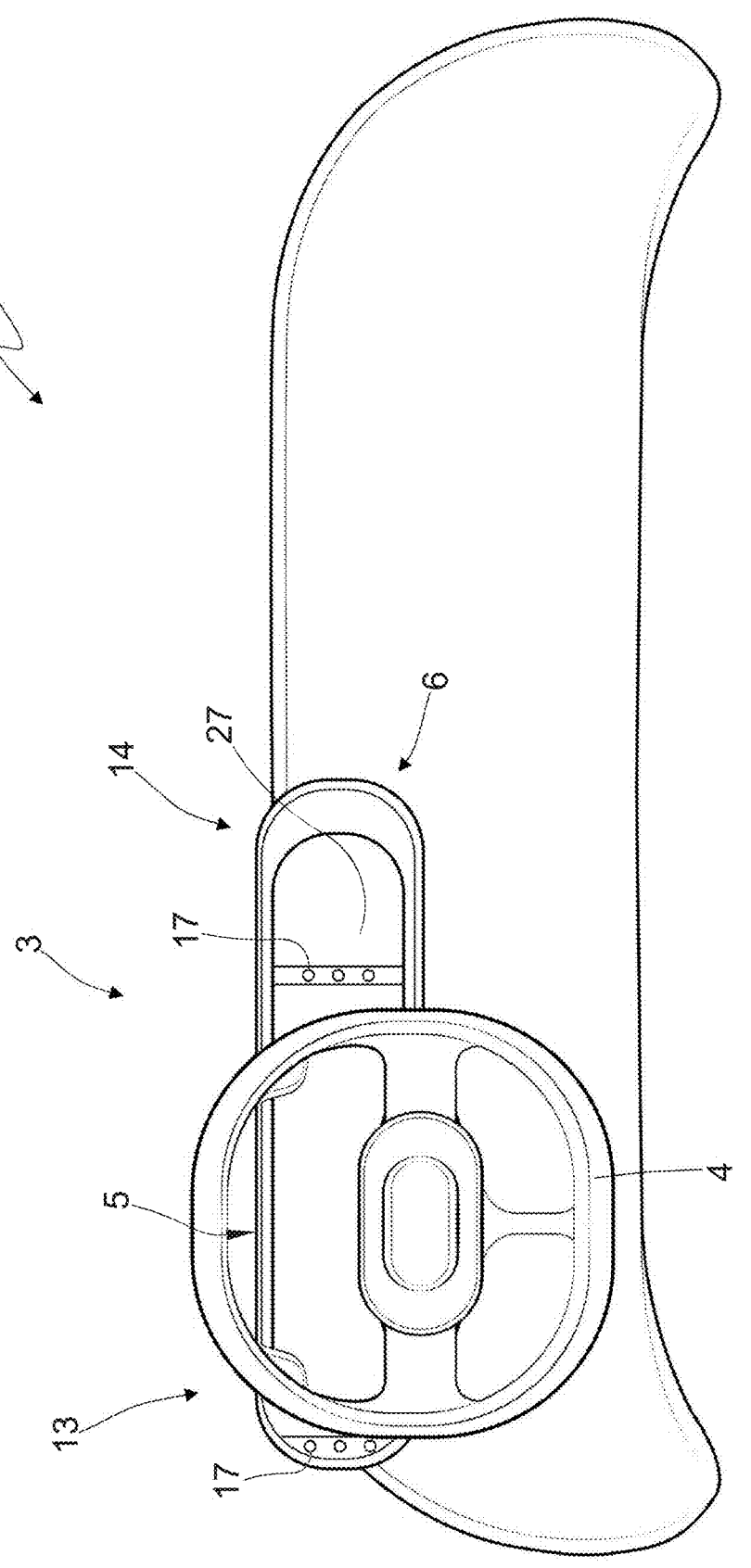

According to an alternative embodiment shown in FIGS. 4 and 5, the central screen 27 can be of the flexible type so that it can be rolled up. For such purpose, the screen 27 comprises a movable outer end 8 on the passenger's side and a fixed end 10 (opposite the movable end 8) coupled to the end of the passenger's side of the plate 5. In such joining point it is fixed to a pin 11 mounted rotatable so that the screen can be rolled up around the pin 11. In other words, the fixed end 10 of the folding screen 27 is integral with the rotatable pin 11 so as to form around the pin 11 a reel (with a variable dimension as it will be explained in the following). Therefore, the folding central screen 27 forms a reel which is wound around the pin 11 and the folding central screen 27 can be unwound or wound around the pin 11 for increasing or decreasing the part of the folding central screen 27 which is exposed (namely is not wound around the pin 11 and thus is visible).

In order to vary the dimension of a visible portion of the folding central screen 27, namely to increase or decrease the exposed (visible) part of the folding central screen 27 which is not wound around the pin 11, the end 9 of the screen is shifted transversely (namely along the transverse direction T). Starting from the situation illustrated in FIG. 2, the movable gripping end 9 (with which the movable end 8 of the folding screen 7 is integral) is shifted transversely (namely along the transverse direction T) leftwards (thus for decreasing the dimension of the part of the folding central screen 27 in sight) so as to pass to the situation illustrated in FIG. 5. Similarly, starting from the situation illustrated in FIG. 5, the movable gripping end 9 (with which the movable end 8 of the folding central screen 27 is integral) is shifted transversely (namely along the transverse direction T) rightwards (thus for increasing the dimension of the part of the folding central screen 27 in sight) so as to pass to the situation illustrated in FIG. 2.

In other words, the movable gripping end 9 (with which the movable end 8 of the folding central screen 27 is integral) can be shifted transversely (namely along the transverse direction T) for varying (increasing or decreasing) the transverse dimension of the part of the folding central screen 27 in sight. In some embodiments, the folding central screen 27 can also disappear completely from sight in a position of minimum dimension; in alternative, the folding central screen 27 could have a small visible part but anyway present in a position of minimum dimension.

According to what is illustrated in FIG. 4, there can be an actuator device 12 (typically an electric motor) which is configured to linearly translate the movable end 9 (with which the movable end 8 of the folding central screen 27 is integral).

According to what is illustrated in FIG. 4, the pin 11 is preferably provided with a tensioning element 15 (typically an elastic element but it could also be an electric motor) which tends to make the pin 11 rotate in the winding direction of the folding central screen 27; namely, the tensioning element 15 applies a torque to the pin 11, which tends to make the pin 11 rotate in the winding direction of the folding central screen 27 and which is countered by the actuator device 12 in such a way that the visible part of the folding central screen 27 is always in tension and thus remains well stretched out.

According to a preferred (but non-limiting) embodiment, the folding central screen 27 is active (i.e. is capable of emitting light of its own) and thus comprises a plurality of light emitters (for example LEDs and preferably OLEDs which allow achieving a high flexibility); according to an alternative embodiment, the folding central screen 27 is a passive surface (i.e. not capable of emitting light of its own) and is configured to reproduce images projected by a video projector arranged inside the dashboard 3 (in this case, a rear projection is performed on the folding central screen 27) or arranged outside the dashboard 3 (in this case, a front projection is performed on the folding central screen 27).

Summarizing what described above, the folding central screen 27 can be (partially or also completely) rolled up on itself by means of a suitable mechanism.

When the folding central screen 27 has a larger visible dimension (because less rolled up around the pin 11) it is capable of displaying a series of pieces of information related to the driving (gear, speed, rotation speed of the drive shaft, ADAS, navigation pictograms, distance from the next turn . . . ) and also a series of pieces of information not related to the driving (audio system, telephony, map navigation, air conditioning, settings . . . ); instead, when the folding central screen 27 has a smaller visible dimension (because more rolled up around the pin 11) it is capable of displaying only the information related to the driving (gear, speed, rotation speed of the drive shaft, ADAS, navigation pictograms, distance from the next turn . . . ).

The movement of the folding central screen 27 for increasing or decreasing the visible portion of the folding central screen 27 can be requested by the driver through a specially provided physical control (push button, roller . . . ), through a virtual control (namely through a display), through a vocal command, or through the selection of a driving style (for example by using the selector called "manettino"); in alternative, the movement of the folding central screen 27 for increasing or decreasing the visible portion of the folding central screen 27 can be performed automatically as a function of the (more or less sporty) driving style with which the driver is driving the road vehicle 1.

According to an alternative embodiment, the actuator device 12 is not provided and thus the movement of the folding central screen 27 for increasing or decreasing the visible portion of the folding central screen 27 is manually impressed by the driver.

Figure 6:
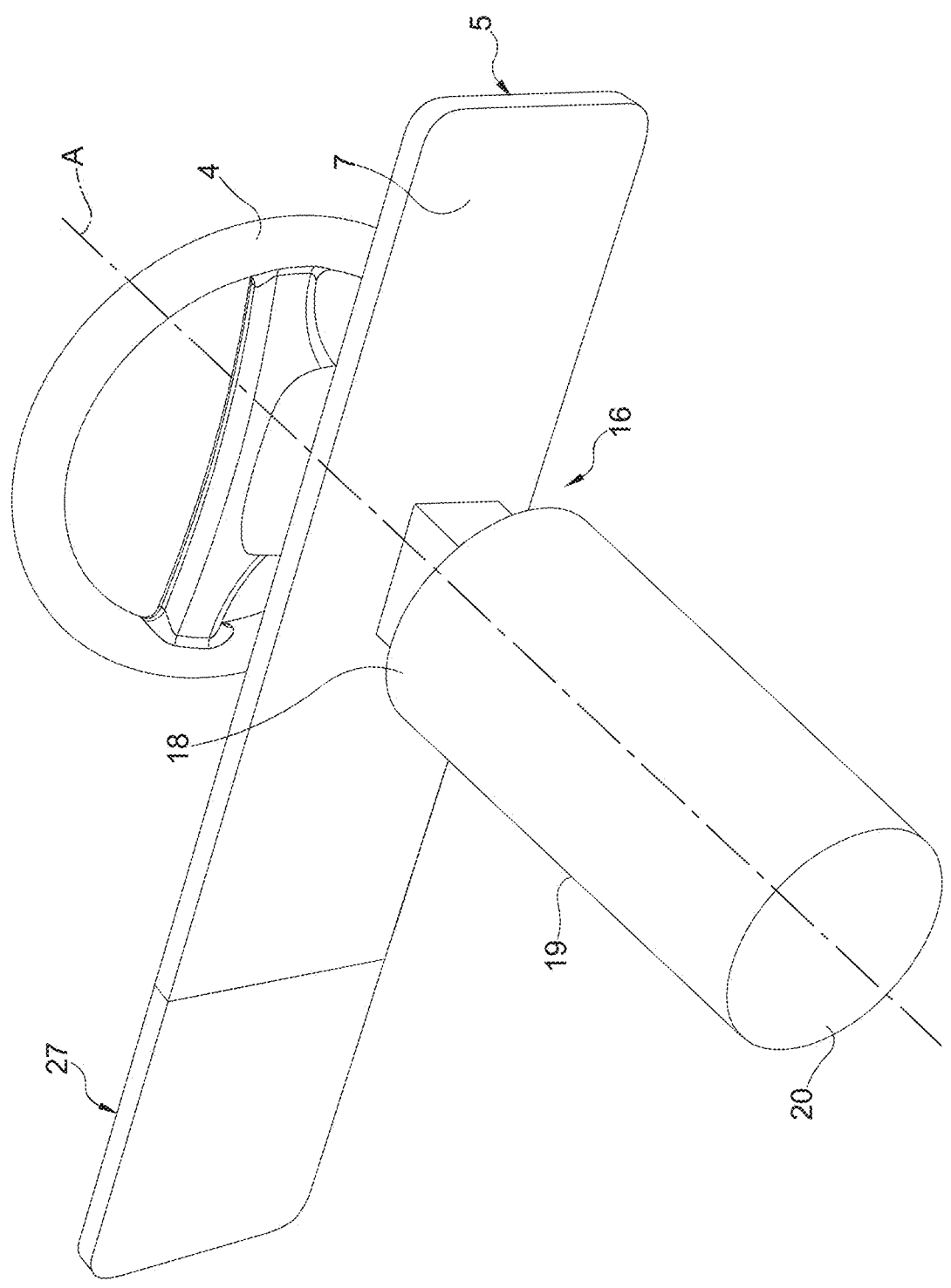

Referring to FIGS. 6-9, according to the invention on one side the central screen 27 can be of folding or roll-up type as described in the foregoing with respect to the plate 5 and on another side the integrated structure, formed by the plate 5 (with the controls 17 and the first screen 7) and by the central screen 27, is integrally coupled to the steering column 16 which supports the steering wheel 4. As is visible in FIG. 6, the steering column is substantially a rod that develops along an axis A of its own in which the steering wheel 4 is centered and comprises, in this example, two portions 18, 19 telescopic with each other so as to vary the overall length of the steering column 16 along the axis A. Since the inner end 20 of the steering column 16 is coupled inside the dashboard 3 in a fixed position along the direction A, by varying the length along the axis A the steering wheel moves closer to or moves away from the axis A with respect to the dashboard 3. As is visible in FIGS. 6 and 7, the steering column thus comprises a first portion 18 having free end that supports the steering wheel 4 and a second end housed inside the second portion 19 with the end 20 axially constrained to the dashboard 3. In this example, at least part of the first portion 18 is outside the dashboard 3 and is integrally coupled to the integrated structure of the plate 5 (controls 17 and the first screen 7) and of the screen 27. In other words, the first portion 18 of the steering column 16 and the integrated structure of the plate 5 (controls 17 and the first screen 7) and of the screen 27 are in actual fact one single piece so that the movement along the axis A of the steering wheel 4 generates a similar movement along the axis A of the integrated structure of the plate 5 (controls 17 and the first screen 7) and of the screen 27 which moves away or moves closer with respect to the fixed dashboard 3. FIG. 7 shows a view with integrated structure of the plate 5 (controls 17 and the first screen 7) and of the screen 27 proximal to the dashboard 3, whereas FIG. 8 shows the integrated structure of the plate 5 (controls 17 and the first screen 7) and of the screen 27 distal from the dashboard 3. Furthermore, according to the present invention the steering column 16 can perform another movement with respect to the dashboard 3, i.e. a rotation around its end 20 opposite the steering wheel 4 along a rotation axis parallel to the transverse direction T. FIG. 6 also exemplifies such movement which leads the integrated structure of the plate 5 (controls 17 and the first screen 7) and of the screen 27 to lower itself or lift itself by rotation in an integral manner with the first portion 18 of the steering column 16.

The embodiments described herein can be combined with one another without departing from the scope of protection of the present invention.

The invention claimed is:

1. Road vehicle having a longitudinal direction parallel to the direction of travel and a transverse direction perpendicular to the longitudinal direction; the road vehicle comprises a steering wheel inside the passenger compartment on the driver's side; a dashboard and a steering column on one side connected to the steering wheel and on the opposite side connected to the dashboard; wherein the dashboard comprises:

a supporting plate behind the steering wheel that supports human-vehicle interface controls and a first information display screen;

a central information display screen along the transverse direction at the side of the supporting plate toward the passenger;

wherein the supporting plate and the central information display screen are integrated with each other in a single structure and both the supporting plate and the central information display screen are integrated into and form a single piece with the steering column;

wherein the central information display screen is coupled to the supporting plate via a movable connector adapted to provide for a plurality of display positions of the central information display screen with respect to the supporting plate;

wherein the steering column is movably constrained with respect to the dashboard to assume a plurality of different driving attitudes; wherein the single structure integrated with the supporting plate and the central information display screen is integrally constrained to the steering column so that moving the steering wheel controls a corresponding movement of the single structure integrated with the plate and the central information display screen.

2. Vehicle as claimed in claim 1, wherein the structure integrating the central screen and the supporting plate is rectangular in shape with larger dimension along the transverse direction.

3. Vehicle as claimed in claim 1, wherein the central screen is hinged to the supporting plate in such a way that it can vary from a display position aligned with the plate along the transverse direction, so as to make a flat surface continuous with the supporting plate, to another display position angled toward the driver wherein between the supporting plate and central screen there is an angle of less than 180°.

4. Vehicle as claimed in claim 1, wherein the central screen is of the roll-up type around its connecting end with the supporting plate to vary the length of the central screen along the transverse direction.

5. Vehicle as claimed in claim 4, wherein there is a motorization to control the rolling up or unrolling of the central screen with respect to the supporting plate.

6. Vehicle as claimed in claim 1, wherein the steering column is made in the form of a telescopic rod having a first end fixed and axially constrained to the dashboard and a second end supporting the steering wheel.

7. Vehicle as claimed in claim 6, wherein the telescopic steering column comprises at least a first portion housed inside the dashboard and at least a second portion at least a part inside the passenger compartment; the structure integrated with the supporting plate and central screen being coupled to the portion of the steering column in the passenger compartment.

8. Vehicle as claimed in claim 1, wherein the steering column is rotatable at the first end around an axis parallel to the transverse direction.

9. Vehicle as claimed in claim 1, wherein the steering column is coupled in the centerline of the supporting plate.

10. Road vehicle having a longitudinal direction parallel to the direction of travel and a transverse direction perpendicular to the longitudinal direction; the road vehicle comprises a steering wheel inside the passenger compartment on the driver's side; a dashboard and a steering column on one side connected to the steering wheel and on the opposite side connected to the dashboard, the steering column having a center longitudinal axis; wherein the dashboard comprises:

a supporting plate behind the steering wheel that supports human-vehicle interface controls and a first information display screen;

a central information display screen along the transverse direction at the side of the supporting plate toward the passenger;

wherein the supporting plate and the central information display screen are integrated with each other in a single structure and both the supporting plate and the central information display screen are integrated into and form a single piece with the steering column such that the center longitudinal axis of the steering column intersects the supporting plate;

wherein the central information display screen is coupled to the supporting plate via a movable connector adapted to provide for a plurality of display positions of the central information display screen with respect to the supporting plate due to the central information display screen being configured to move independently relative to the first information display screen;

wherein the steering column is movably constrained with respect to the dashboard to assume a plurality of different driving attitudes; wherein the single structure integrated with the supporting plate and the central information display screen is integrally constrained to the steering column so that moving the steering wheel controls a corresponding movement of the single structure integrated with the plate and the central information display screen.

11. Vehicle as claimed in claim 10, wherein the center longitudinal axis intersects the supporting plate at a location between a top edge and a bottom edge of the supporting plate.

12. Vehicle as claimed in claim 10, wherein the central information display screen, in its entirety, is located laterally offset from the steering wheel.

13. Vehicle as claimed in claim 10, wherein a rolled portion of the central information display screen is disposed behind the supporting plate.

* * * * *